United States Patent
Ha et al.

(10) Patent No.: US 6,489,587 B2
(45) Date of Patent: Dec. 3, 2002

(54) FABRICATION METHOD OF ERBIUM-DOPED SILICON NANO-SIZE DOTS

(75) Inventors: Jeong-Sook Ha; Kyoung-Wan Park, both of Taejon; Seung-Min Park, Seoul; Young-Jo Ko, Taejon, all of (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 09/752,671

(22) Filed: Dec. 28, 2000

(65) Prior Publication Data

US 2002/0066720 A1 Jun. 6, 2002

(30) Foreign Application Priority Data

Dec. 1, 2000 (KR) ........................................ 2000-72320

(51) Int. Cl.[7] .............................................. B23K 26/00
(52) U.S. Cl. .............................. 219/121.6; 219/121.68; 219/121.69
(58) Field of Search ........................ 219/121.6, 121.68, 219/121.69, 121.85, 121.76; 420/578

(56) References Cited

U.S. PATENT DOCUMENTS

| 5,483,037 A | | 1/1996 | Mashburn |
| 5,534,079 A | * | 7/1996 | Beach .......................... 148/33 |
| 5,558,788 A | | 9/1996 | Mashburn |
| 5,580,663 A | * | 12/1996 | Campisano et al. ........ 428/446 |
| 5,618,760 A | | 4/1997 | Soh et al. |
| 5,760,366 A | * | 6/1998 | Haruta et al. .......... 219/121.68 |
| 5,990,605 A | * | 11/1999 | Yoshikawa et al. ......... 313/310 |
| 6,037,243 A | * | 3/2000 | Ha et al. ..................... 438/528 |
| 6,118,140 A | * | 9/2000 | Nakajima et al. ............. 257/64 |
| 6,242,326 B1 | * | 6/2001 | Ro et al. ..................... 438/493 |

OTHER PUBLICATIONS

Cobalt doping in BaTiO3 thin films by two–target pulsed KrF laser ablation with in situ laser annealing by Atsushi Ito et al.
Room temperature luminescence from erbium–doped silicon thin films prepared by laser ablation by S. Komuro et al.
Structure and optical properties of silicon nanocrystallites prepared by pulsed–laser ablation in inert background gas by N. Suzuki et al.

* cited by examiner

Primary Examiner—M. Alexandra Elve
(74) Attorney, Agent, or Firm—Blakely Sokoloff Taylor & Zafman

(57) ABSTRACT

An apparatus for fabricating silicon thin films for use in laser ablation includes a silicon substrate rotatably mounted in a process chamber maintaining a ultra high vacuum, pulsed light source means mounted outside the process chamber for emitting a pulsed light beam, target rotating means mounted in the process chamber for rotating a plurality of targets mounted therein, the targets being made of a different material, light beam splitting means for splitting the pulsed light beam into double light beams of the same intensity, light beam intensity regulating means for regulating the intensity of the double light beams, wherein the targets are mounted to face the silicon substrate so as to uniformly overlap the vaporization products of the targets generated by irradiating the double light bears on the silicon substrate.

11 Claims, 3 Drawing Sheets

FABRICATION METHOD OF ERBIUM-DOPED SILICON NANO-SIZE DOTS

FIELD OF THE INVENTION

The present invention relates to a method for fabricating nano-size dots and, more particularly, to a method for fabricating erbium-doped silicon nano-size dots using the pulsed laser deposition in combination with the ultra high vacuum chemical etching reaction. Erbium-doped silicon nano-size dots thus produced have high purity, density and luminous efficiency.

DESCRIPTION OF THE PRIOR ART

In general, although silicon (Si) is unusable as an optical material because it has an indirect band gap, using the nano-sizing quantum effect in combination with luminescent material doping technology permits the realization of a silicon-based electrooptic method. Namely, it is necessary to have a doping method that enables efficient luminescence and a method for producing nanometer-scale particles.

Recently, many attempts have been made to produce erbium-doped silicon nano-size dots by chemical vapor deposition (CVD), sputtering, pulse laser deposition (PLD) techniques, and the like. Such erbium-doped silicon nano-size dots are used as a novel material for light sources having a wavelength of 1540 nm, at which the silica optical fiber has a very low absorbance. However, there is a need of using the pulsed laser deposition (PLD) in combination with the ultra high vacuum chemical etching reaction in order to maximize the erbium doping concentration and to have nanometer-scale size, both of which are essential to achieve a high luminescent efficiency.

The pulsed laser deposition (PLD) allows an increase in the erbium concentration by 10 to 100 times relative to the known chemical vapor desposition (CVD) or sputtering, and the ultra high vacuum chemical etching reaction enables production of a nano-scale structure under restricted conditions that prevent potential introduction of impurities, thus enhancing the electrooptic efficiency.

In a first example of the prior art for fabricating silicon thin films, multiple targets are mounted in a process chamber to produce multi-element thin films by pulsed laser deposition (PLD) (See, Douglas N. Mashburn et al., "Multiple target laser ablation system", Jan. 5, 1996, U.S. Pat. No. 5,483,037). This method deposits thin films using the pulsed laser deposition, in which multiple targets are mounted in a high vacuum process chamber and excimer laser beams are alternately irradiated on the individual targets to vaporize the components of each target to be deposited on a film, which is placed at a position to face the targets. That is, the intensity of the laser beam irradiated on the individual target can be regulated so as to control the amount of the element to be deposited on the film, thereby facilitating deposition of multi-element films such as YBCO.

In a second example of the prior art for pulsed laser deposition (PLD), a laser beam is split by a beam splitting means and the split beams are simultaneously irradiated on the same point of a target from different directions via a mirror so as to uniformly assign the irradiation time of the laser beam on the surface of the target (See, Douglas N. Mashburn et al., "Dual beam optical system for pulsed laser ablation film deposition", Sep. 24, 1996, U.S. Pat. No. 5,558,788). This method maintains the efficiency of the laser ablation on the surface of the target for a long time in uniformly depositing the thin films to prevent texturing on the surface of the target and places the plume to face the target in order to uniformly deposit the thin films on the target.

In a third example of the prior art for fabricating erbium-doped silicon thin films by pulsed laser deposition (PLD), a KrF laser beam having a wavelength of 248 nm is irradiated on a target which is prepared by mixing $Er_2O_3$ powder with silicon powder for laser ablation (See, Shuji Komuro et al., "Room temperature luminescence from erbium-doped silicon thin films prepared by laser ablation", Applied Physics Letters, Vol. 69, No. 25, p3896–3898, Dec. 26, 1996).

In a fourth example of the prior art, a method for fabricating silicon nano-size crystals by pulsed laser ablation under the inert gas atmosphere is disclosed, which adopts a process for fabricating well-dispersed silicon nano-size crystals under controlled laser conditions and examines the effect of the pressure of the inert gas on the transition of amorphous silicon thin films to nano-size crystals (See, Nobuyasu Szuki et al., "Structure and optical properties of silicon nanocrystallities prepared by pulsed laser ablation in inert background gas". Applied Physics Letters, vol. 76, No. 11, p1389–1391, Mar. 13, 2000).

However, as disclosed in the third example of the prior art, the use of a target prepared by firing a mixture of $Er_2O_3$ powder and silicon powder at a high temperature in the fabrication of erbium-doped silicon thin films by pulsed laser deposition (PLD) contains a possibility of contamination with impurities and requires a plurality of targets that are different in the doping concentration.

SUMMARY OF THE INVENTION

It is an object of the present invention to solve the problems with the prior art and to provide an apparatus and method for fabricating silicon thin films, in which a highly pure solid target is vaporized in a ultra high vacuum process chamber so as to prevent any potential introduction of impurities and the intensity of the laser beam is regulated to vary the doping concentration.

It is another object of the present invention to provide a method for fabricating erbium-doped silicon nano-size dots with high electroluminescence efficiency and high purity using a surface chemical reaction on the erbium-doped silicon thin films.

In one aspect of the present invention, there is provided an apparatus for fabricating silicon thin films, which uses laser ablation, the apparatus including: a silicon substrate rotatably mounted in a process chamber maintaining a ultra high vacuum; pulsed light source means mounted outside the process chamber for emitting a pulsed light beam; target rotating means mounted in the process chamber for rotating a plurality of targets mounted therein, the targets being made of a different material; light beam splitting means for splitting the pulsed light beam into double light beams of appropriate intensities; light beam intensity regulating means for regulating the intensity of the double light beams. The targets are mounted to face the silicon substrate so as to uniformly overlap the vaporization products of the targets generated by irradiating the double light beams on the silicon and erbium targets.

In another aspect of the present invention, there is provided a method for fabricating silicon nano-size dots, the method including the steps of: forming erbium-doped silicon thin films on a silicon substrate by pulsed laser ablation under ultra high vacuum; nitrifying the surface of the silicon thin films to form a plurality of silicon nitride islands; selectively etching the silicon thin films which is not capped by silicon nitride by way of oxygen-induced etching to form erbium-doped silicon nano-size dots.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
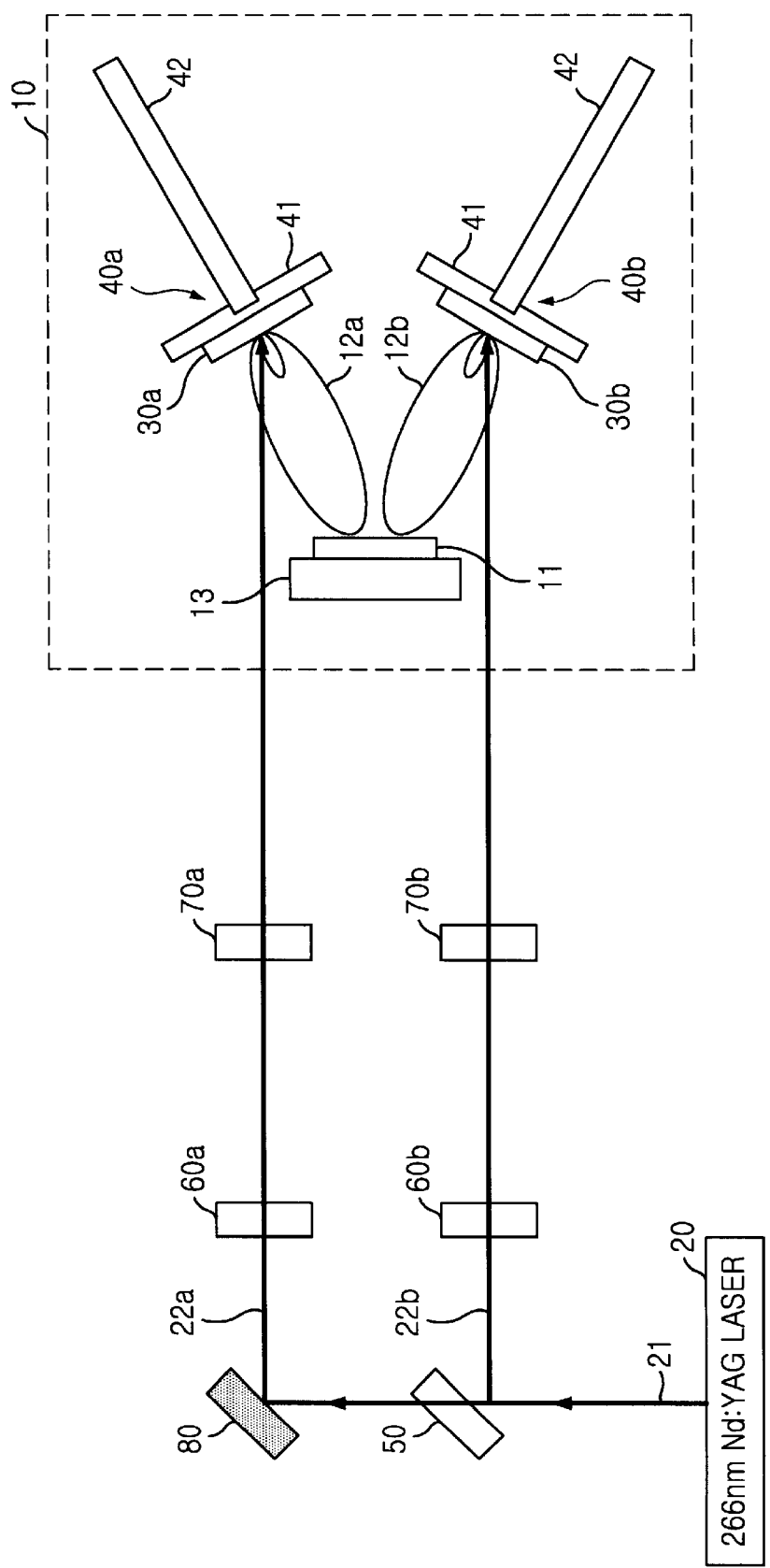
FIG. 1 is a schematic diagram of an apparatus for fabricating erbium-doped silicon thin films using laser ablation according to an embodiment of the present invention.

FIG. 1 is a schematic diagram of an apparatus for fabricating erbium-doped silicon thin films using laser ablation according to an embodiment of the present invention.

As shown in FIG. 1, the apparatus for depositing erbium-doped silicon thin films using laser ablation includes: a silicon substrate 11 rotatably provided in a process chamber 10, maintaining a ultra high vacuum; a pulsed light source means 20 provided outside the process chamber 10 for emitting a pulsed light beam 21; target rotating means 30a and 30b which are mounted in the target rotating means 30a and 30b and made of a different material; a light beam splitting means 50 for splitting the pulsed light beam 21 into double light beams 22a and 22b of appropriate intensities; light beam intensity regulating means 60a, 60b, 70a, 70b for regulating the intensity of the double light beams 22a and 22b; and irradiating the light beams 22a and 22b straight on the targets 30a and 30b. The targets 30a and 30b are placed to face the silicon substrate 11 so that plumes 12a and 12b of the targets 30a and 30b generated under the double light beams 22a and 22b uniformly overlap with each other on the silicon substrate 11. Out of the double light beams 22a and 22b split by the light beam splitting means 50, the light beam 22a irradiated on the silicon target 30a is reflected by a mirror 80 and then directed to the light beam intensity regulating means 60a.

Preferably, the silicon substrate 11 is heated in the temperature range from 500° C. to 600° C. with a heater block 13 installed therein and rotated to maintain uniformity during the subsequent step of depositing silicon thin films. The light source means 20 includes an Nd:YAG laser having a wavelength of 266 nm. The one of the targets 30a and 30b is silicon (Si) target 30a and the other is erbium (Er) target 30b, both of which targets 30a and 30b take the form of a disc.

The target rotating means 40a and 40b include a support 41 for supporting the targets 30a and 30b, and a rotor 42 for rotating the support 41.

The light beam splitting means 50 is a beam splitter. The light beam intensity regulating means 60a and 60b are half wave plates and 70a and 70b are polarizers. Changing the relative angle of the optical axis of the half wave plates against the polarizing axis of the polarizers makes it possible to regulate the intensity of the double light beams 22a and 22b. For example, the intensity of the light beam 22b irradiated on the erbium target 30b is variable to control the doping concentration of the erbium in the silicon thin films.

The vaporization products generated by the double light beams 22a and 22b form the plumes 12a and 12b, which contain erbium (Er) and silicon (Si) moving towards the silicon substrate 11 heated in the temperature range from 500° C. to 600° C. to form a deposit of erbium-doped silicon thin films.

The thickness of the silicon films deposited can be controlled through changing the intensity or radiation time of the light beam irradiated on the silicon target 30a.

The thickness of the silicon films deposited can be controlled through changing the intensity or radiation time of the light beam irradiated on the silicon target 30a.

In a method for fabricating erbium-doped silicon thin films using such an apparatus for deposition of silicon thin films, the silicon substrate 11 is first placed in the process chamber 10 maintained under ultra high vacuum, and double targets, i.e., erbium (Er) target and silicon (Si) target are mounted in the process chamber 10 to face the silicon substrate 11. Subsequently, the double light beams 22a and 22b are irradiated on the double targets 30a and 30b to yield vaporization products. With the silicon substrate 11 heated erbium and silicon contained in the plumes 12a and 12b are allowed to move towards the silicon substrate 11 so as to form erbium-doped silicon thin films on the silicon substrate 11.

Figure 2A:
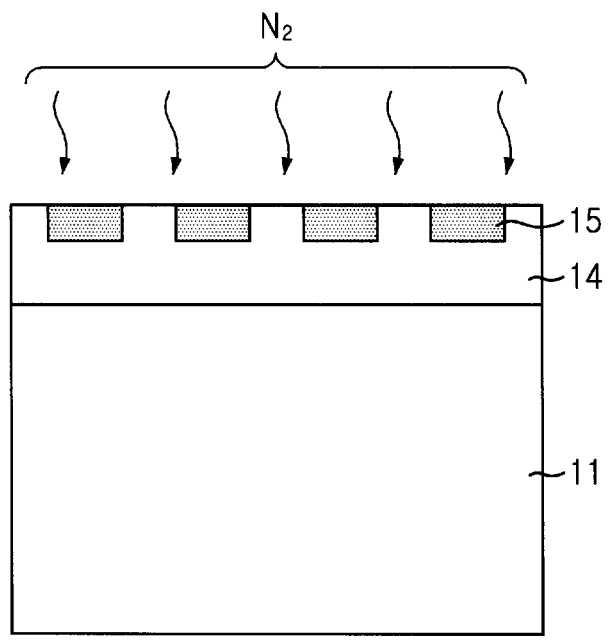
FIGS. 2a to 2c are diagrams showing a method for fabricating erbium-doped silicon nano-size dots using surface chemical reactions.
Figure 2B:
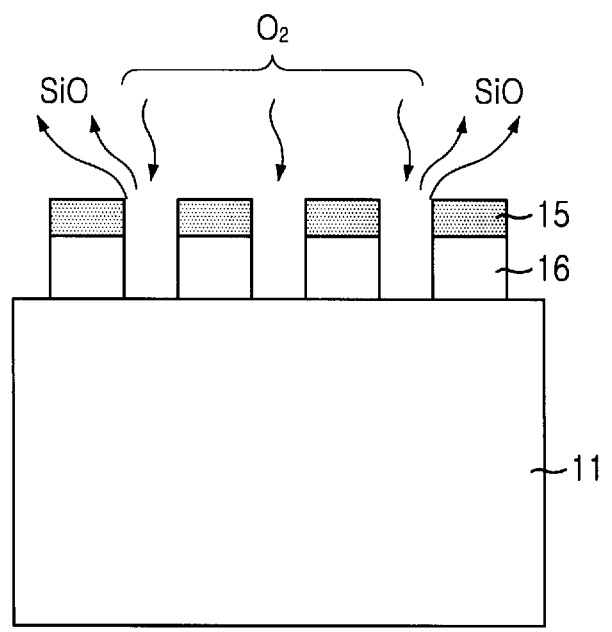
Figure 2C:
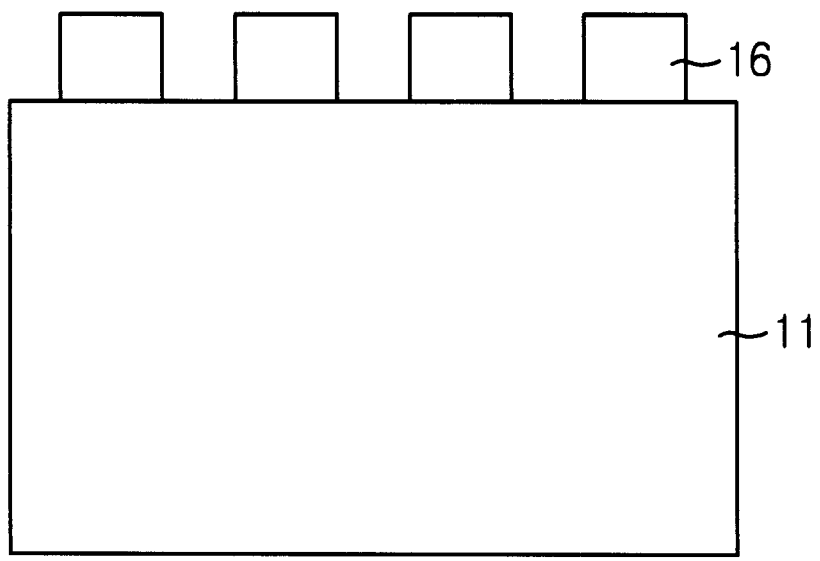

FIGS. 2a to 2c are diagrams showing a method for fabricating erbium-doped silicon nano-size dots using surface chemical reactions.

As shown in FIG. 2a, an erbium-doped silicon thin film 14 which is prepared with the apparatus for deposition of silicon thin films as illustrated in FIG. 1 is heated in the temperature range from 700° C. to 800° C. and reacted with nitrogen ($N_2$) gas to form silicon nitride islands 15 having a nano-meter-order size and a single-layer thickness of 0.3 nm. Here, the partial pressure of the nitrogen ($N_2$) gas is $1 \times 10^{-5}$ torr. Reference numeral 11 denotes the silicon substrate. The silicon nitride islands 15 are not so reactive to the oxygen gas and thus can be used as a mask in the subsequent step.

The nanometer-scale silicon nitride islands 15 are formed at intervals by nitrification and used as a mask so that the process can be performed in a short time at a low cost.

As shown in FIG. 2b, the surface of the erbium-doped silicon films 14 with the silicon nitride islands 15 formed thereon are heated in the temperature range from 700° C. to 800° C. Then, a highly pure oxygen ($O_2$) gas is introduced to allow selective etching of the silicon thin films 14. For example, silicon oxide (SiO) gas is generated through the reaction between silicon (Si) and oxygen ($O_2$) according to the following reaction formula 1:

Reaction Formula 1

Meanwhile, the partial pressure of the oxygen gas is maintained at $1 \times 30^{-7}$ torr and silicon nano-size dots 16 are formed without reaction of the silicon thin films 14 covered with the silicon nitride islands 15. The heights of the silicon nano-size dots 16 can be controlled through varying the amount of the oxygen gas introduced.

As shown in FIG. 2c, the silicon nitride islands 15 covering the silicon nano-size dots 16 are selectively removed by introducing $CF_4^+$ ions with an energy of 100 to 200 eV.

Subsequently, a postannealing is conducted at 900° C. to recover the atomically damaged surfaces of the silicon substrate 11 and the silicon nano-size dots 16.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

As described above, the present invention uses a separate erbium-doped target and readily controls the erbium doping concentration in the silicon thin films by varying the intensity of the laser beam irradiated on the target, thus producing erbium-doped silicon thin films with good quality and uniformity in the erbium doping concentration.

Furthermore, the present invention employs surface chemical reactions such as nitrification and oxygen etching reaction to regulate the size and density of the erbium-doped silicon nano-size dots and thereby enhance the electrooptic efficiency of the silicon as well as the purity of the silicon nano-size dots.

What is claimed is:

1. A method for fabricating silicon thin films, which uses laser ablation, the method comprising the steps of:

mounting a silicon substrate in a process chamber maintaining a ultra high vacuum;

mounting double targets comprising an erbium target and a silicon target in the process chamber, the double targets being mounted to face the silicon substrate;

irradiating laser beams on the double targets to vaporize the double targets; and heating the silicon substrate and moving erbium and silicon in the plumes generated through vaporization of the double targets to form erbium-doped silicon thin films on the silicon substrate.

2. The method as claimed in claim 1, wherein in the step of vaporizing the double targets, the intensity of the laser beam irradiated on the erbium target is varied in order to regulate the doping concentration of erbium.

3. The method as claimed in claim 1, wherein in the step of vaporizing the double targets, either the intensity or the radiation time of the laser beam irradiated on the silicon target is varied in order to regulate the thickness of the silicon thin films.

4. The method as claimed in claim 1, wherein the silicon substrate is rotated while heated.

5. The method as claimed in claim 1, wherein the double targets are rotated after being mounted.

6. A method for fabricating silicon nano-size dots, the method comprising the step of:

forming erbium-doped silicon thin films on a silicon substrate by pulsed laser ablation under ultra high vacuum;

nitrifying the surface of the silicon thin films to form silicon nitride islands; and selectively etching the silicon thin films which are not capped by silicon nitride islands by way of oxygen-induced etching to form erbium-doped silicon nano-size dots.

7. The method as claimed in claim 6, wherein the step of forming the silicon thin films comprises the steps of:

irradiating laser beams on the double target comprising an erbium target and a silicon target to form vaporization products; and rotating the silicon substrate under heating to deposit erbium and silicon contained in the vaporization products.

8. The method as claimed in claim 6, wherein the step of forming the silicon nitride islands comprises the step of injecting a nitrogen gas while heating the silicon thin films.

9. The method as claimed in claim 6, wherein the step of etching the silicon thin films comprises the steps of:

introducing a highly pure oxygen gas while heating the silicon thin films including the silicon nitride islands; and using the silicon nitride islands as a mask and reacting the introduced oxygen gas with the silicon thin films.

10. The method as claimed in claim 6, wherein further comprising the steps of:

after forming the silicon nano-size dots, removing the conductive islands covering the silicon nano-size dots; and annealing the silicon substrate including the silicon nano-size dots.

11. The method as claimed in claim 10, wherein the step of removing the silicon nitride islands introduces $CF_4^+$ ions with an energy of 100 to 200 eV to selectively remove the silicon nitride islands.

* * * * *